(12) United States Patent
Kyogoku

(10) Patent No.: US 8,379,681 B2
(45) Date of Patent: Feb. 19, 2013

(54) LASER DIODE DRIVING DEVICE AND IMAGE FORMING APPARATUS INCLUDING THE SAME

(75) Inventor: Hiroaki Kyogoku, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 72 days.

(21) Appl. No.: 12/810,251

(22) PCT Filed: Dec. 15, 2008

(86) PCT No.: PCT/JP2008/073151
§ 371 (c)(1),
(2), (4) Date: Jun. 23, 2010

(87) PCT Pub. No.: WO2009/084468
PCT Pub. Date: Jul. 9, 2009

(65) Prior Publication Data
US 2010/0290491 A1    Nov. 18, 2010

(30) Foreign Application Priority Data
Dec. 28, 2007    (JP) .................................. 2007-339655

(51) Int. Cl.
*H01S 3/00* (2006.01)
(52) U.S. Cl. ............... 372/38.01; 372/38.02; 372/38.03; 372/38.07
(58) Field of Classification Search ............... 372/38.01, 372/38.02, 38.03, 38.07
See application file for complete search history.

(56) References Cited

U.S. PATENT DOCUMENTS

| | | | |
|---|---|---|---|
| 5,568,464 A * | 10/1996 | Horie | 369/116 |
| 5,912,694 A * | 6/1999 | Miyake et al. | 347/247 |
| 2004/0032890 A1 | 2/2004 | Murata | |
| 2007/0053395 A1 * | 3/2007 | Kamatani et al. | 372/38.02 |
| 2008/0008062 A1 * | 1/2008 | Rees et al. | 369/47.1 |

FOREIGN PATENT DOCUMENTS

| | | |
|---|---|---|
| JP | 2644722 | 5/1997 |
| JP | 10-93170 | 4/1998 |
| JP | 2910103 | 4/1999 |
| JP | 2001-190563 | 7/2000 |
| JP | 3365094 | 11/2002 |
| JP | 3466599 | 8/2003 |
| JP | 2004-13932 | 1/2004 |
| JP | 3541407 | 4/2004 |

(Continued)

OTHER PUBLICATIONS

International Search Report in PCT/JP2008/073151.

*Primary Examiner* — Yuanda Zhang
(74) *Attorney, Agent, or Firm* — Cooper & Dunham LLP

(57) ABSTRACT

A disclosed laser diode driving device drives laser diodes with driving currents obtained by adding switch currents to corresponding bias currents and includes a common switch current generating circuit configured to generate a common switch current according to an input signal; switch current generating circuits provided for the corresponding laser diodes and configured to generate the switch currents based on the common switch current and input signals; switches configured to control the output of the switch currents to the corresponding laser diodes according to input signals; bias current generating circuits configured to generate the bias currents and output the generated bias currents to the corresponding laser diodes; and a control unit configured to detect the light intensities of the respective laser diodes and to control the common switch current generating circuit, the switch current generating circuits, and the switches to adjust the light intensities of the respective laser diodes.

12 Claims, 12 Drawing Sheets

FOREIGN PATENT DOCUMENTS

| | | |
|---|---|---|
| JP | 2004-153114 | 5/2004 |
| JP | 2004-288869 | 10/2004 |
| JP | 2005-11943 | 1/2005 |
| JP | 2005-32798 | 2/2005 |
| JP | 2005-129842 | 5/2005 |
| JP | 2005-129843 | 5/2005 |
| JP | 3687621 | 6/2005 |
| JP | 3880914 | 11/2006 |
| JP | 2006-351945 | 12/2006 |
| JP | 2007-73543 | 3/2007 |
| JP | 4082956 | 2/2008 |
| JP | 4108321 | 4/2008 |
| JP | 4125582 | 5/2008 |
| JP | 4146711 | 6/2008 |
| JP | 2008-182278 | 8/2008 |
| JP | 2009-164191 | 7/2009 |

\* cited by examiner

LASER DIODE DRIVING DEVICE AND IMAGE FORMING APPARATUS INCLUDING THE SAME

TECHNICAL FIELD

A certain aspect of the present invention relates to a laser diode driving device for controlling laser diodes and an image forming apparatus including the laser diode driving device.

BACKGROUND ART

In a laser recording device that forms an image according to image signals by scanning a recording medium with laser beams from laser diodes, light intensity control is performed to regulate the laser output of the laser diodes.

When a threshold current Ith is a current at which a laser diode suddenly starts to emit light and a light-emission current Iη is a current that is greater than the threshold current Ith and required to obtain a desired laser output, the threshold current Ith and the light-emission current Iη vary depending on the laser diode because of variations in manufacturing processes. Still, the light intensity of a laser diode linearly increases as the light-emission current Iη increases. In other words, the light-emission current and the light intensity of a laser diode are proportional.

Normally, in a laser diode driving device, an operating current Iop (bias current Ibi+switch current Isw), which consists of a bias current Ibi to be constantly supplied to the laser diode and a switch current Isw to be supplied according to a modulation signal based on image information, is controlled based on detected actual laser outputs to stably obtain a desired laser output.

In light intensity control in such a laser diode driving device, the response characteristics of a laser diode to an input pulse signal during image formation can be improved by making the bias current Ibi smaller than and as close as possible to the threshold current Ith. Therefore, the bias current Ibi is normally set at a value slightly smaller than the threshold current Ith.

There are several known technologies for detecting the threshold current Ith for each laser diode and setting the bias current Ibi based on the detected threshold current Ith.

For example, patent document 1 discloses a technology for detecting the threshold current Ith using multiple reference voltages and a sample-and-hold circuit and setting the bias current Ibi based on the detected threshold current Ith. However, with the disclosed technology using a sample-and-hold circuit that holds an analog voltage in a capacitor, the bias current Ibi may fluctuate because of a leakage current during a holding period. Particularly, when the holding period becomes long, the fluctuation caused by the leakage current becomes larger.

As another example, patent document 2 discloses a technology where the light intensity of a laser diode is detected with an A/D converter and the bias current Ibi and the switch current Isw are set by D/A converters. Using D/A converters to set the bias current Ibi and the switch current Isw makes it possible to eliminate the above mentioned problem caused by a leakage current in a sample-and-hold circuit. However, although it depends on the setting accuracy of light intensity, D/A converters with a resolution of 10 bits or greater are necessary for the above purpose. Such high-resolution D/A converters increase the chip size and costs of a semiconductor integrated circuit used for a laser diode driving device.

Meanwhile, in the field of laser printers and digital copiers that use laser diodes as light sources, there is a growing demand for high-resolution and high-speed devices. To increase the resolution and printing speed of a device using only one laser beam, it is necessary to increase the modulating speed that is a speed of turning on and off a laser diode according to input image data. However, there is a limit to this approach of increasing the modulating speed. Therefore, to further increase the resolution and printing speed of a device, it is necessary to increase the number of laser beams. Assuming that the modulating speed and the printing speed are the same as those when one laser beam is used, using four laser beams makes it possible to double the resolution in the main- and sub-scanning directions (lengthwise and crosswise). When the resolution is the same, using four laser beams makes it possible to increase the printing speed by four times.

Semiconductor lasers used as light sources are roughly divided into two types: an edge-emitting laser that emits a laser beam in a direction parallel to the active layer and a surface-emitting laser that emits a laser beam in a direction perpendicular to the active layer. Edge-emitting lasers that emit one, two, or four laser beams are popularly used for printers and copiers. When eight laser beams are necessary, for example, eight single-beam lasers each emitting one laser beam, four multi-beam lasers each emitting two laser beams, or two multi-beam lasers each emitting four laser beams may be used. The price of a laser increases as the number of emitting beams increases. The positional relationships between optical axes of laser beams of a multi-beam laser are stable. On the other hand, when single-beam lasers are used to provide multiple laser beams, it is necessary to adjust the positional relationships between optical axes of the laser beams by adjusting the positions of the single-beam lasers in an apparatus. Therefore, using a multi-beam laser makes it easier to adjust positional relationships between optical axes of laser beams.

Also, because of structural limitations, it is technically difficult to increase the number of laser beams of an edge-emitting laser. Meanwhile, the number of laser beams of a surface-emitting laser can be comparatively easily increased. Therefore, a surface-emitting laser is preferable to increase the speed and resolution of a device by increasing the number of laser beams. For the above reasons, developments of devices such as laser printers and digital copiers using surface-emitting lasers capable of emitting a large number of laser beams as light sources have been very active these past years to meet the demand for high-speed, high-resolution devices. For example, a surface-emitting laser may be configured to emit 30 to 40 laser beams.

Generally, an edge-emitting laser includes an internal light-receiving element. Therefore, for example, when two multi-beam lasers each including one light-receiving element and emitting four laser beams are used to provide eight laser beams, one fourth of a light-intensity adjustment period can be used for adjusting the intensity of each laser beam. Meanwhile, a surface-emitting laser, because of its structure, cannot include an internal light-receiving element and therefore has to use an external light-receiving element. Also, because the axes of laser beams are close to each other in a surface-emitting laser, it is difficult to separately detect multiple laser beams with different light-receiving elements at once. For these reasons, for example, when a surface-emitting laser is capable of emitting 40 laser beams, only one fortieth of a light-intensity adjustment period can be used for adjusting the intensity of each laser beam.

During one scanning period (for scanning one line), time usable for adjusting light intensity is very limited. For example, when a light-intensity control device capable of adjusting the intensities of four laser beams during one scanning period is used to adjust 40 laser beams of a surface-emitting laser, the intensities of the 40 laser beams can be adjusted only once during 10 scanning periods. This is particularly a problem when a sample-and-hold circuit is used to generate a bias current. With a sample-and-hold circuit, a detected sample value must be held in a capacitor while the light intensity of the corresponding laser beam cannot be adjusted. For example, the holding period required when the light intensity can be adjusted only once during 10 scanning periods is ten times longer than that required when the intensity adjustment can be performed once in each scanning period. In such a case, the fluctuation in the generated bias current caused by a leakage current becomes too large to be ignored.

FIG. 13 is a schematic block diagram illustrating an exemplary circuit configuration of a related art laser diode driving device. Below, the number of bits required for a D/A converter for setting a light-emission current is described with reference to FIG. 13.

In FIG. 13, a bias current control circuit controls a bias current that is smaller than a threshold current and a switch current control circuit controls a switch current that is proportional to the light intensity. Also, it is assumed that the light intensity is controlled within a setting range and the light-emission current is adjusted within a setting range between 1.25 mA and 5 mA. For example, to set the light intensity in units of 0.5% or smaller (with a resolution of 0.5% or smaller), it is necessary to be able to set the light-emission current in units of 0.5% or smaller (with a resolution of 0.5% or smaller).

Based on the above assumptions, when the maximum output current of a D/A converter is 5 mA, a setting scale of at least 200 steps (a resolution of 0.5% or 6.25 μA) is necessary to output the minimum output current of 1.25 mA. When a setting scale has 250 steps (a resolution of 0.4% or 5 μA) per 1.25 mA, 1000 steps (5 mA/5 μA) are necessary per 5 mA. Thus, in this case, a D/A converter with a resolution of 10 bits is necessary to set a light-emission current.

Meanwhile, as the number of bits of a D/A converter increases, higher output accuracy is required. Also, when the number of bits of a D/A converter increases by one, the area of the D/A converter on a semiconductor integrated circuit (IC) becomes two times larger. For example, to drive a multi-beam laser capable of emitting 40 beams, it is necessary to provide 40 D/A converters with a 10-bit resolution on the same IC. Accordingly, such a configuration increases the chip size and costs of a semiconductor integrated circuit.

[Patent document 1] Japanese Patent No. 3687621
[Patent document 2] Japanese Patent No. 3365094

As described above, there is a trend to increase the number of laser beams to improve the speed and resolution of a device. However, increasing the number of beams increases the period of time during which the light intensity of a laser beam cannot be adjusted. Therefore, if an analog sample-and-hold circuit is used to adjust light intensity, the bias current may fluctuate because of a leakage current during a holding period. Meanwhile, with a method using D/A converters, which generate predetermined currents based on a constant current and digital data, the above problem can be prevented. However, this method requires a laser beam driving circuit, which is equivalent to that used to drive a single-beam laser, for each of the laser beams of a multi-beam laser and therefore increases the chip size and costs of a semiconductor integrated circuit used for a laser diode driving device.

DISCLOSURE OF THE INVENTION

Aspects of the present invention provide a laser diode driving device and an image forming apparatus that solve or reduce one or more problems caused by the limitations and disadvantages of the related art.

An aspect of the present invention provides a laser diode driving device for driving laser diodes with driving currents obtained by adding switch currents to corresponding bias currents less than or equal to threshold currents of the laser diodes and for controlling the driving currents to adjust light intensities of the laser diodes. The laser diode driving device includes a common switch current generating circuit configured to generate a common switch current according to an input signal; switch current generating circuits provided for the corresponding laser diodes and configured to generate the switch currents based on the common switch current and according to input signals; switches configured to control the output of the switch currents to the corresponding laser diodes according to input signals; bias current generating circuits configured to generate the bias currents and output the generated bias currents to the corresponding laser diodes; and a control unit configured to detect the light intensities of the respective laser diodes and to control the common switch current generating circuit, the switch current generating circuits, and the switches to adjust the light intensities of the respective laser diodes.

Another aspect of the present invention provides an image forming apparatus including the above laser diode driving device.

BEST MODE FOR CARRYING OUT THE INVENTION

Preferred embodiments of the present invention are described below with reference to the accompanying drawings.

Figure 1:
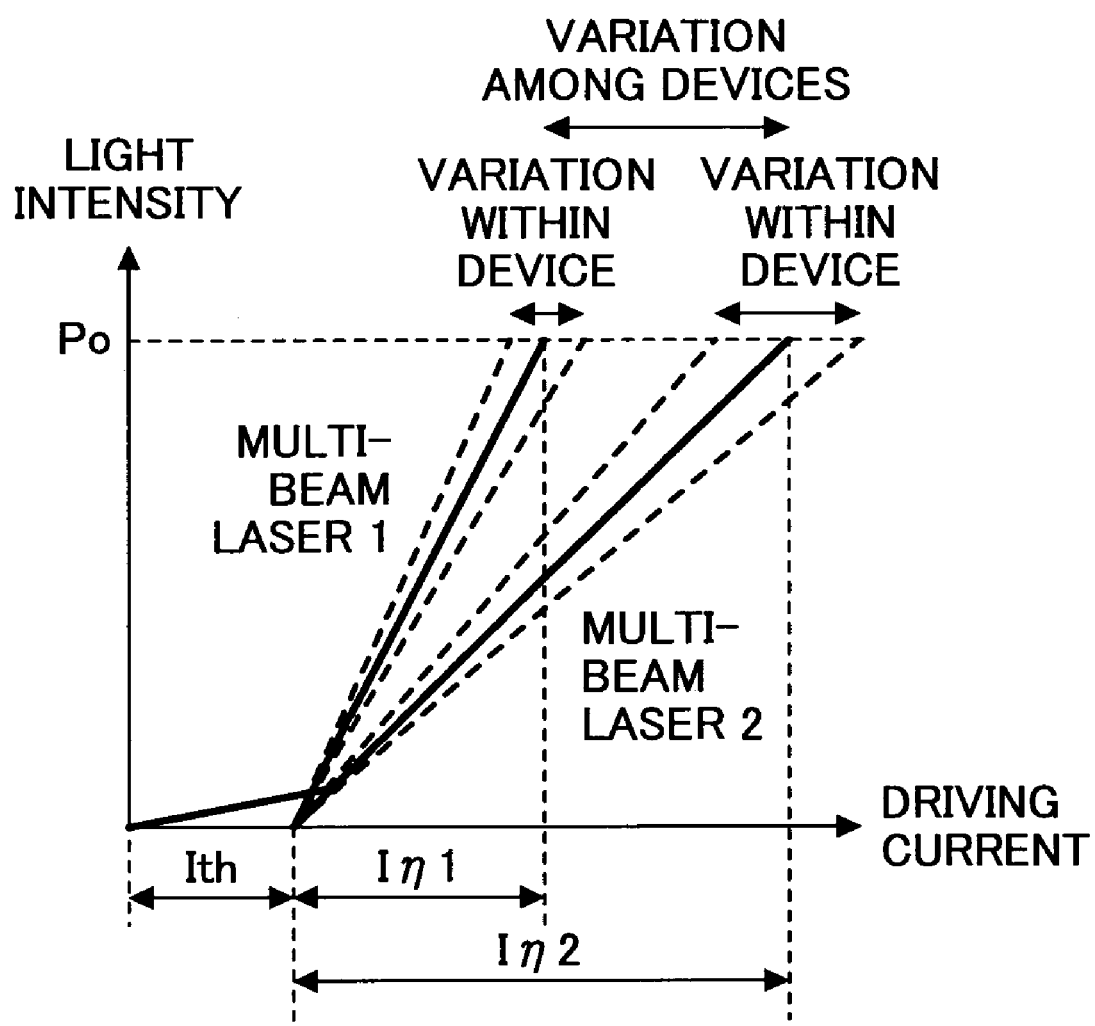
FIG. 1 is a graph showing variations in light-emission currents of multi-beam lasers.

As shown in FIG. 1, the driving current required to achieve a desired light intensity varies greatly from one multi-beam laser (laser device) to another because of manufacturing variations as in the case of single-beam lasers. Meanwhile, variations among laser diodes in a multi-beam laser are smaller than those among multi-beam lasers because the laser diodes in the same multi-beam laser are produced through the same process. For example, the differential efficiency indicating the ratio of light intensity to the driving current varies from about 0.5 W/A to about 1 W/A among multi-beam lasers because of manufacturing variations. On the other hand, the differential efficiency varies plus or minus about 10% among laser diodes in a multi-beam laser.

For the above reason, a laser diode driving device according to an embodiment of the present invention controls a multi-beam laser (laser device) including multiple laser diodes as follows: a D/A converter having a high resolution and a wide output current range is used for generating a common switch current used to set switch currents corresponding to the setting range of light intensity and to correct the variations among multi-beam lasers; and D/A converters provided for the respective laser diodes are used to multiply the common switch current by values determined based on digital data and thereby to generate switch currents for correcting variations among the laser diodes in the multi-beam laser. This configuration makes it possible to correct variations among laser devices with one D/A converter having high resolution and a wide output current range and to correct variations among laser diodes in a laser device with low-resolution D/A converters provided for the respective laser diodes. Accordingly, compared with a conventional configuration that requires high-resolution D/A converters for the number of laser diodes, the configuration of this embodiment makes it possible to reduce the circuit size of a laser diode driving device.

Figure 2:
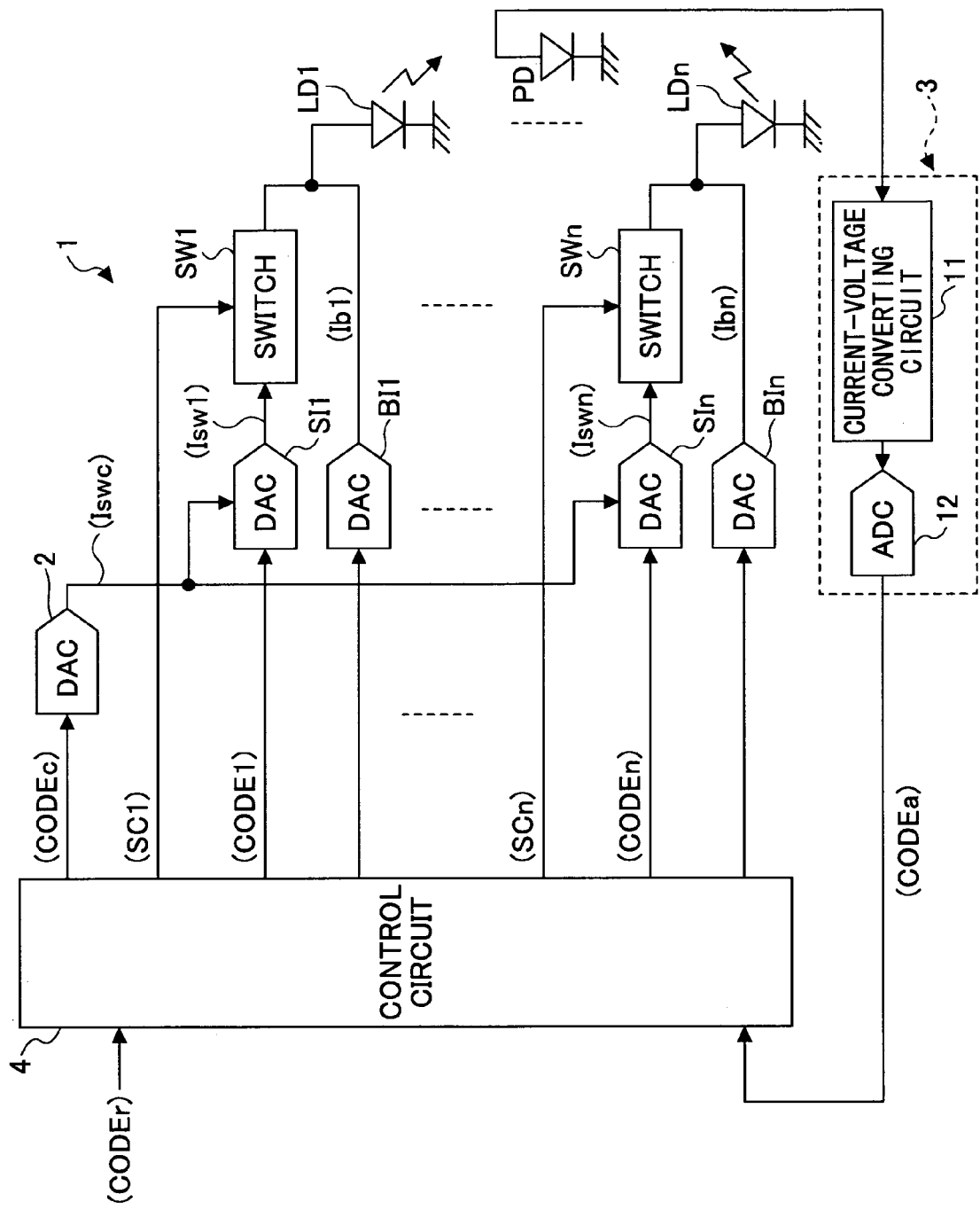
FIG. 2 is a block diagram illustrating an exemplary configuration of a laser diode driving device 1 according to an embodiment of the present invention.

FIG. 2 is a block diagram illustrating an exemplary configuration of a laser diode driving device 1 according to an embodiment of the present invention.

As shown in FIG. 2, the laser diode driving device 1 controls laser diodes LD1 through LDn (n indicates an integer greater than 1) constituting at least a part of a laser device (e.g., a multi-beam laser) capable of emitting multiple laser beams to achieve a desired light intensity.

The laser diode driving device 1 includes a common switch current generating circuit 2 for generating a common switch current Iswc, switch current generating circuits SI1 through SIn for generating switch currents Isw1 through Iswn to be supplied to the corresponding laser diodes LD1 through LDn based on the common switch current Iswc, and bias current generating circuits BI1 through BIn for generating bias currents Ib1 through Ibn to be supplied to the corresponding laser diodes LD1 through LDn. The laser diode driving device 1 also includes switches SW1 through SWn for outputting the switch currents Isw1 through Iswn generated by the switch current generating circuits SI1 through SIn to the corresponding laser diodes LD1 through LDn; a photodiode PD; a light intensity detecting circuit 3 for converting a current output from the photodiode PD into a voltage and outputting the voltage; and a control circuit 4 for controlling the common switch current generating circuit 2, the switch current generating circuits SI1 through SIn, the bias current generating circuits BI1 through BIn, and the switches SW1 through SWn.

The light intensity detecting circuit 3, the control circuit 4, and the photodiode PD may be collectively called a control unit. The common switch current generating circuit 2, the switch current generating units SI1 through SIn, the bias current generating circuits BI1 through BIn, the switches SW1 through SWn, and the control circuit 4 may be integrated on one IC.

The common switch current generating circuit 2 is, for example, implemented by a 10-bit D/A converter and generates the common switch current Iswc according to a digital data signal CODEc input from the control circuit 4.

The respective switch current generating circuits SI1 through SIn are implemented by D/A converters and generate the switch currents Isw1 through Iswn that are proportional to the common switch current Iswc according to corresponding digital data signals CODE1 through CODEn input from the control circuit 4. More specifically, the switch current generating circuits SI1 through SIn multiply, respectively, the common switch current Iswc by proportionality constants $\alpha 1$ through $\alpha n$ corresponding to the digital data signals CODE1 through CODEn and thereby generate the switch currents Isw1 through Iswn.

The bias current generating circuits BI1 through BIn may be implemented by D/A converters. The bias current generating circuits BI1 through BIn generate the bias currents Ib1 through Ibn that are close to or slightly smaller than the threshold currents of the corresponding laser diodes LD1 through LDn. The bias current generating circuits BI1 through BIn supplies the generated bias currents Ib1 through Ibn to the corresponding laser diodes LD1 through LDn.

The switches SW1 through SWn are turned on and off according to control signals SC1 through SCn output from the control circuit 4. When turned on, the switches SW1 through SWn output the switch currents Isw1 through Iswn generated by the switch current generating circuits SI1 through SIn to the corresponding laser diodes LD1 through LDn.

The light intensity detecting circuit 3 includes a current-voltage converting circuit 11 and an A/D converter 12. The current-voltage converting circuit 11 converts a current output from the photodiode PD into a voltage. The A/D converter 12 converts from analog to digital the voltage output from the current-voltage converting circuit 11 to generate a digital data signal CODEa and outputs the digital data signal CODEa to the control circuit 4.

Based on the digital data signal CODEa input from the A/D converter 12, the control circuit 4 generates the digital data signals CODEc and CODE1 through CODEn and the control signals SC1 through SCn such that the laser diodes LD1 through LDn emit laser beams with a desired intensity.

An exemplary process of setting the common switch current Iswc performed by the control circuit 4 is described below with reference to FIG. 3.

Figure 3:
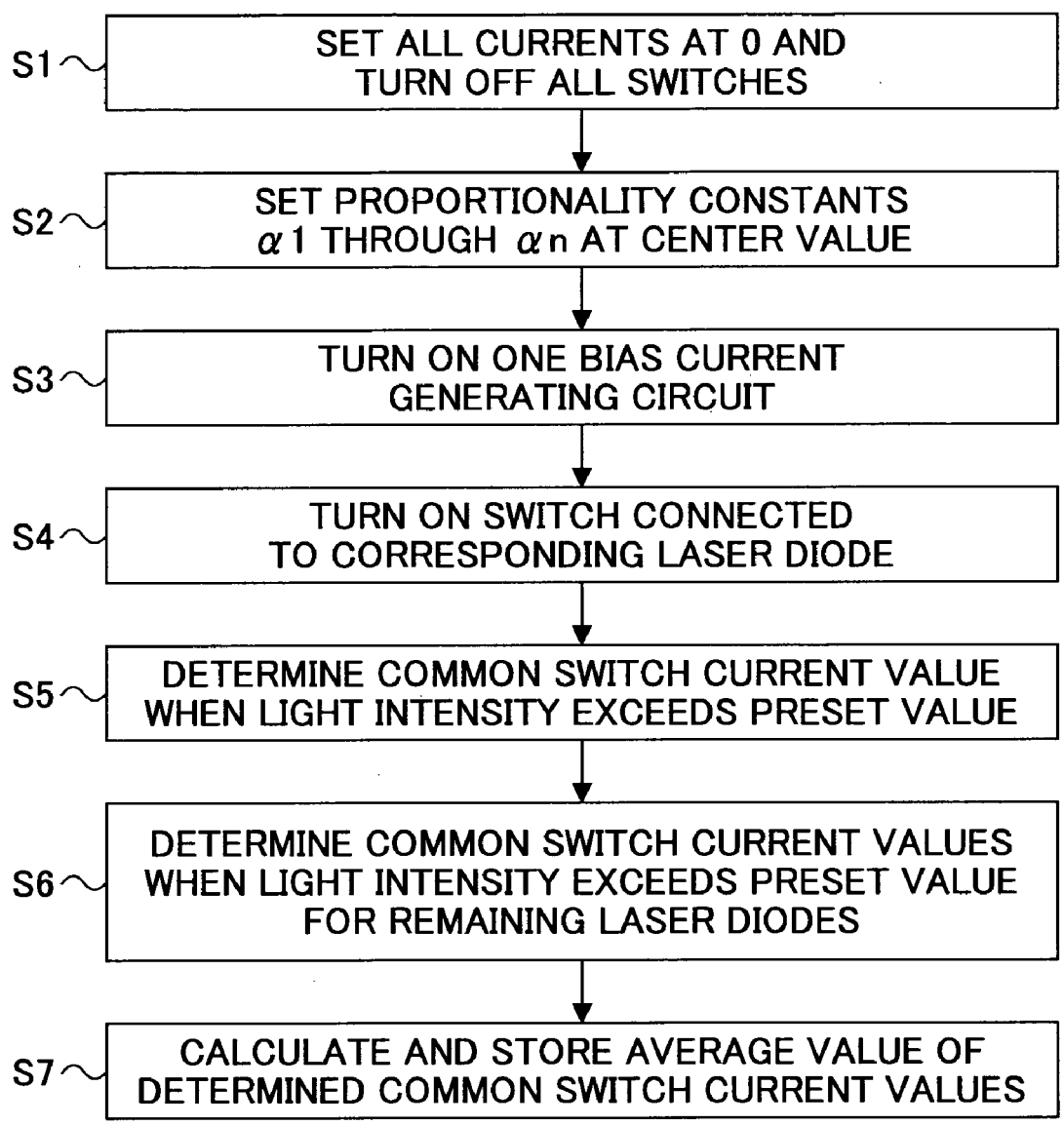
FIG. 3 is a flowchart showing an exemplary process of setting a common switch current Iswc performed by a control circuit 4.

In step S1 shown in FIG. 3, the control circuit 4 generates and outputs the digital data signal CODEc such that the common switch current Iswc becomes 0, turns off the switches SW1 through SWn, and causes the bias current generating circuits BI1 through BIn to stop outputting the bias currents Ib1 through Ibn. Next, in step S2, the control circuit 4 generates and outputs the digital data signal CODE1 such that the proportionality constant $\alpha 1$ becomes the center value in its setting range. Then, the control circuit 4 causes the bias current generating circuit BI1 to output the bias current Ib1 in step S3 and turns on the switch SW1 in step S4.

In step S5, the control circuit 4 outputs the digital data signal CODEc and thereby causes the common switch current generating circuit 2 to increase the common switch current Iswc until the light intensity indicated by the digital data signal CODEa input from the A/D converter 12 exceeds the light intensity indicated by a reference digital data signal CODEr input from the outside. The control circuit 4 stores a current value Iswc1 of the common switch current Iswc at the time when the light intensity indicated by the digital data signal CODEa input from the A/D converter 12 exceeds the light intensity indicated by the reference digital data signal CODEr input from the outside.

In step S6, the control circuit 4 repeats steps similar to steps S2 through S5 for the switch current generating circuits SI2 through SIn, the bias current generating circuits BI2 through BIn, and the switches SW2 through SWn, and stores obtained current values Iswc2 through Iswcn of the common switch current Iswc. Then, in step S7, the control circuit 4 calculates and stores an average value of the current values Iswc1 through Iswcn. The control circuit 4 generates the digital data signal CODEc such that the common switch current Iswc becomes equal to the stored average value and outputs the generated digital data signal CODEc to the common switch current generating circuit 2. Alternatively, in step 7, the control circuit 4 may be configured to generate the digital data signal CODEc such that the common switch current Iswc becomes equal to the center value between the highest and lowest values of the current values Iswc1 through Iswcn and to output the generated digital data signal CODEc to the common switch current generating circuit 2.

An exemplary process of calculating the proportionality constants α1 through αn performed by the control circuit 4 is described below with reference to FIG. 4.

Figure 4:
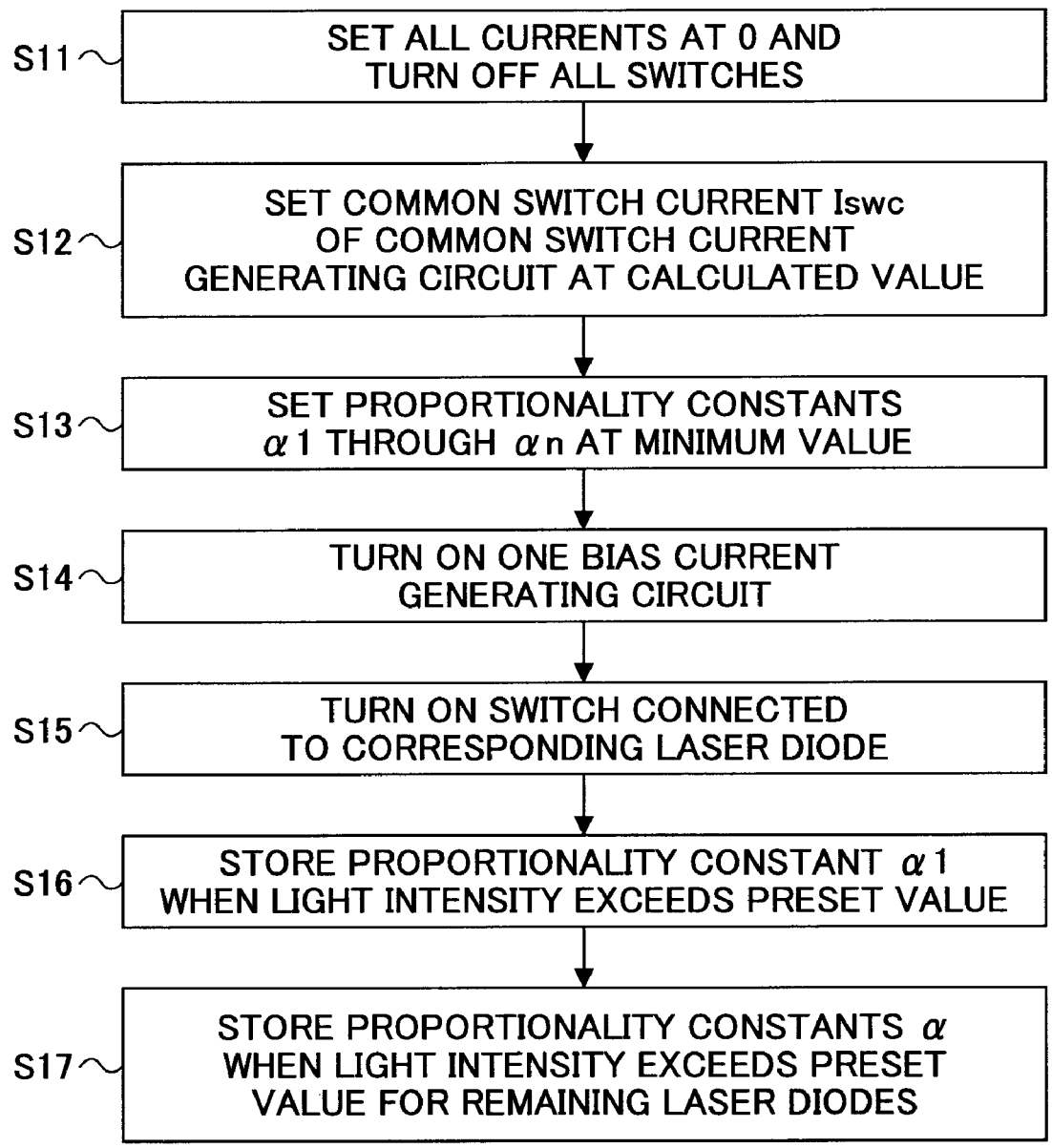
FIG. 4 is a flowchart showing an exemplary process of calculating proportionality constants α1 through αn performed by the control circuit 4.

In step S11 shown in FIG. 4, the control circuit 4 generates and outputs the digital data signal CODEc such that the common switch current Iswc becomes 0, turns off the switches SW1 through SWn, and causes the bias current generating circuits BI1 through BIn to stop outputting the bias currents Ib1 through Ibn. Next, in step S12, the control circuit 4 generates the digital data signal CODEc such that the common switch current Iswc becomes equal to the average value stored during the process shown in FIG. 3 and outputs the generated digital data signal CODEc to the common switch current generating circuit 2.

In step S13, the control circuit 4 generates and outputs the digital data signals CODE1 through CODEn such that the respective proportionality constants α1 through αn become the minimum value in the setting range. Then, the control circuit 4 causes the bias current generating circuit BI1 to output the bias current Ib1 in step S14 and turns on the switch SW1 in step S15. In step S16, the control circuit 4 increases the proportionality constant α1 until the light intensity indicated by the digital data signal CODEa input from the A/D converter 12 exceeds the light intensity indicated by the reference digital data signal CODEr input from the outside, and stores the value of the proportionality constant α1 at the time when the light intensity indicated by the digital data signal CODEa input from the A/D converter 12 exceeds the light intensity indicated by the reference digital data signal CODEr input from the outside.

In step S17, the control circuit 4 repeats steps similar to steps S12 through S16 for the switch current generating circuits SI2 through SIn, the bias current generating circuits BI2 through BIn, and the switches SW2 through SWn, and stores obtained values of the proportional constants α2 through αn. The control circuit 4 generates the digital data signals CODE1 through CODEn such that the proportional constants α1 through αn become equal to the stored values and outputs the generated digital data signals CODE1 through CODEn to the corresponding switch current generating circuits SI1 through SIn.

The control circuit 4 periodically corrects the light intensities of the laser diodes LD1 through LDn. This correction process is described below with reference to FIG. 5.

Figure 5:
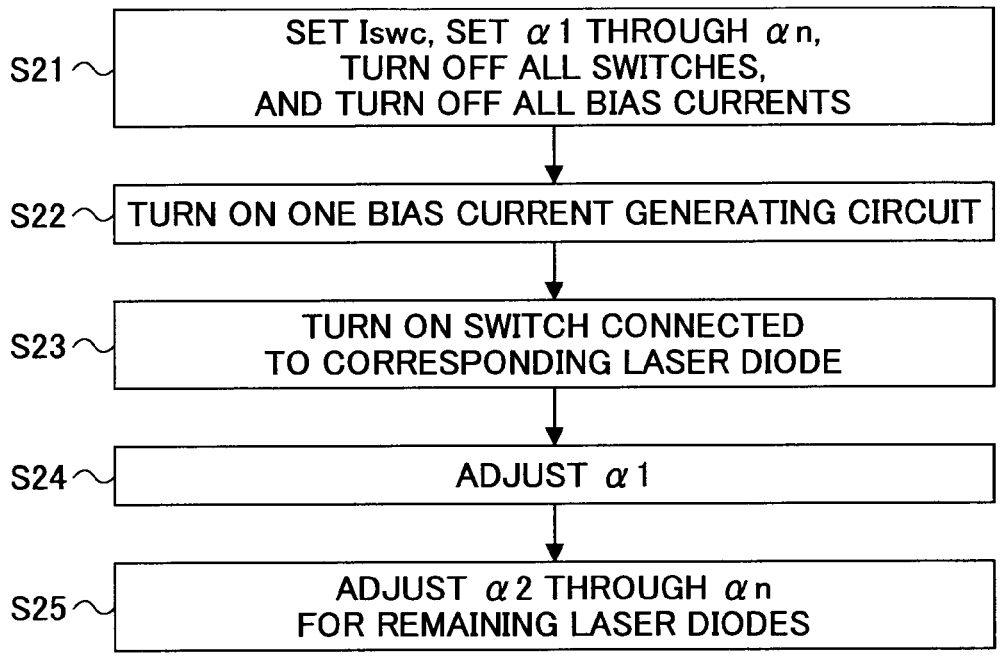
FIG. 5 is a flowchart showing an exemplary process of adjusting the light intensities of laser diodes LD1 through LDn performed by the control circuit 4.

In step S21 shown in FIG. 5, the control circuit 4 turns off the switches SW1 through SWn; causes the bias current generating circuits BI1 through BIn to stop outputting the bias currents Ib1 through Ibn; generates the digital data signal CODEc such that the common switch current Iswc becomes equal to the average value stored during the process shown in FIG. 3 and outputs the generated digital data signal CODEc to the common switch current generating circuit 2; and generates the digital data signals CODE1 through CODEn such that the proportional constants α1 through αn become equal to the values stored during the process shown in FIG. 4 and outputs the generated digital data signals CODE1 through CODEn to the corresponding switch current generating circuits SI1 through SIn.

Next, the control circuit 4 causes the bias current generating circuit BI1 to output the bias current Ib1 in step S22 and turns on the switch SW1 in step S23. Then, in step S24, the control circuit 4 adjusts the proportionality constant α1 based on the light intensity indicated by the digital data signal CODEa input from the A/D converter 12. More specifically, if the light intensity indicated by the digital data signal CODEa input from the A/D converter 12 is greater than the light intensity indicated by the reference digital data signal CODEr input from the outside, the control circuit 4 generates and outputs the digital data signal CODE1 such that the proportionality constant α1 becomes smaller.

On the other hand, if the light intensity indicated by the digital data signal CODEa input from the A/D converter 12 is not greater than the light intensity indicated by the reference digital data signal CODEr input from the outside, the control circuit 4 generates and outputs the digital data signal CODE1 such that the proportionality constant α1 becomes larger. In step S25, the control circuit 4 repeats steps similar to steps S22 through S24 for the switch current generating circuits SI2 through SIn, the bias current generating circuits BI2 through BIn, and the switches SW2 through SWn, and thereby corrects the light intensities of the laser diodes LD1 through LDn.

Figure 6:
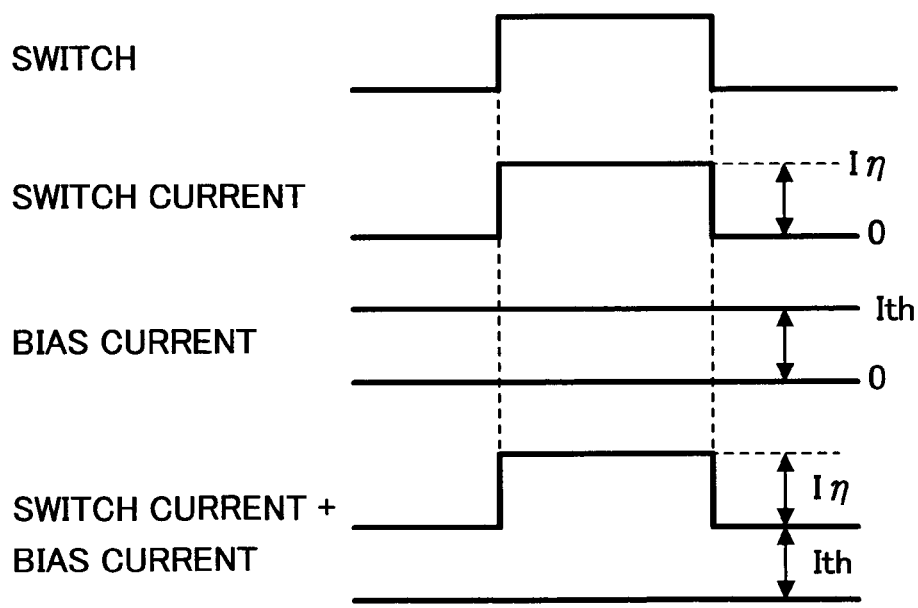
FIG. 6 is a timing chart illustrating an exemplary method of supplying a switch current and a bias current.

Thus, as shown in FIG. 6, when the bias currents Ib1 through Ibn are input and the switches SW1 through SWn are turned on, the laser diodes LD1 through LDn are caused to emit light with a predetermined intensity by currents that are the sums of the bias currents Ib1 through Ibn and the corresponding switch currents Isw1 through Iswn. When the corresponding switches SW1 through SWn are turned off, the laser diodes LD1 through LDn stop emitting light.

In the above embodiment, the bias current generating circuits BI1 through BIn are configured to continuously output the bias currents Ib1 through Ibn. If a current close to the threshold current is supplied continuously to a laser diode when the laser diode is not supposed to emit light, the laser diode may emit light with an intensity of 500 μW or lower, and this light may expose a photoconductor and cause scumming (smear on a non-image area). Also, continuously supplying a current close to the threshold current to a laser diode may shorten the operational lifetime of the laser diode.

Figure 7:
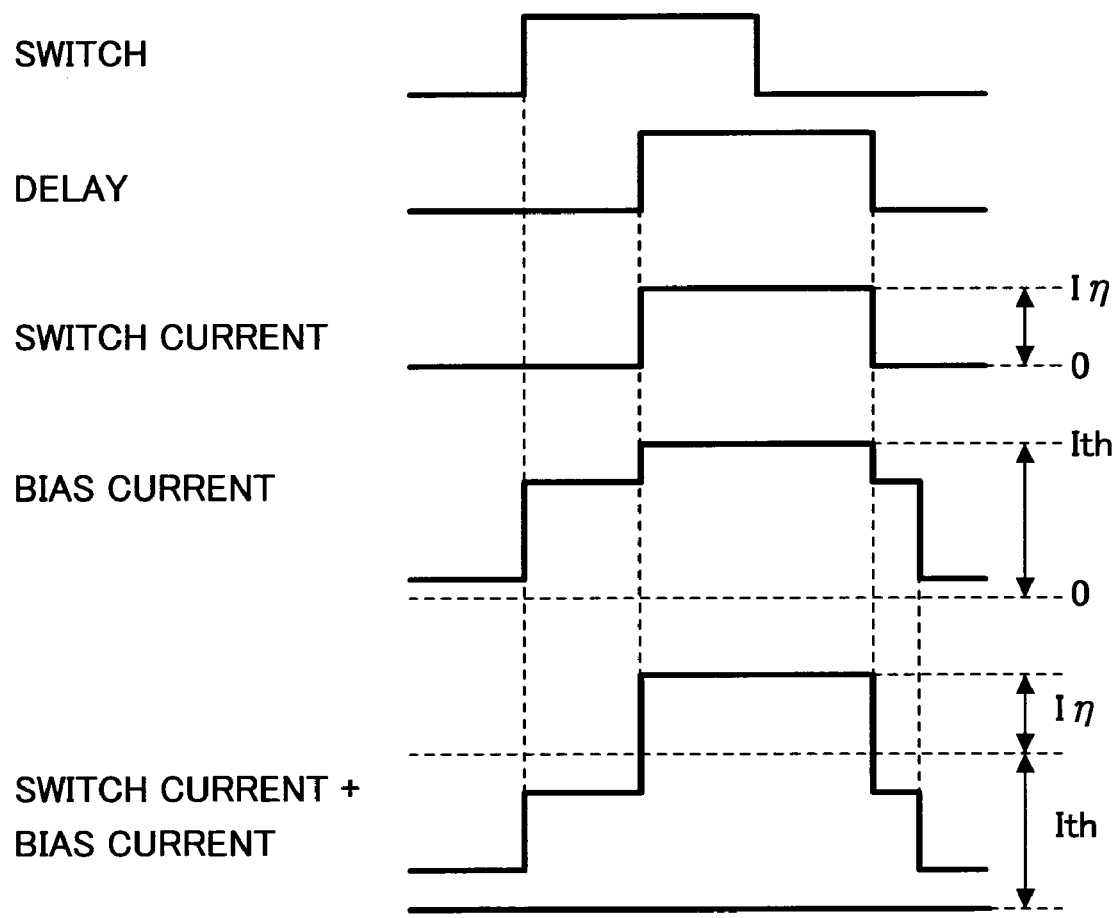
FIG. 7 is a timing chart illustrating another exemplary method of supplying a switch current and a bias current.

For the above reason, instead of continuously outputting bias currents, the bias current generating circuits BI1 through BIn may be configured to output bias currents according to the control signals SC1 through SCn to reduce the currents supplied to laser diodes when they are not supposed to emit light. For example, the bias current generating circuits BI1 through BIn may be configured to generate bias currents close to the threshold currents just before the laser diodes are turned on and to supply the generated bias currents to the laser diodes. Also, the bias current generating circuits BI1 through BIn may be configured to output bias currents Ib1 through Ibn with varying values. For example, the bias current generating circuits BI1 through BIn may be configured to output bias currents Ib1 through Ibn each of which takes three values as shown in FIG. 7.

Figure 8:
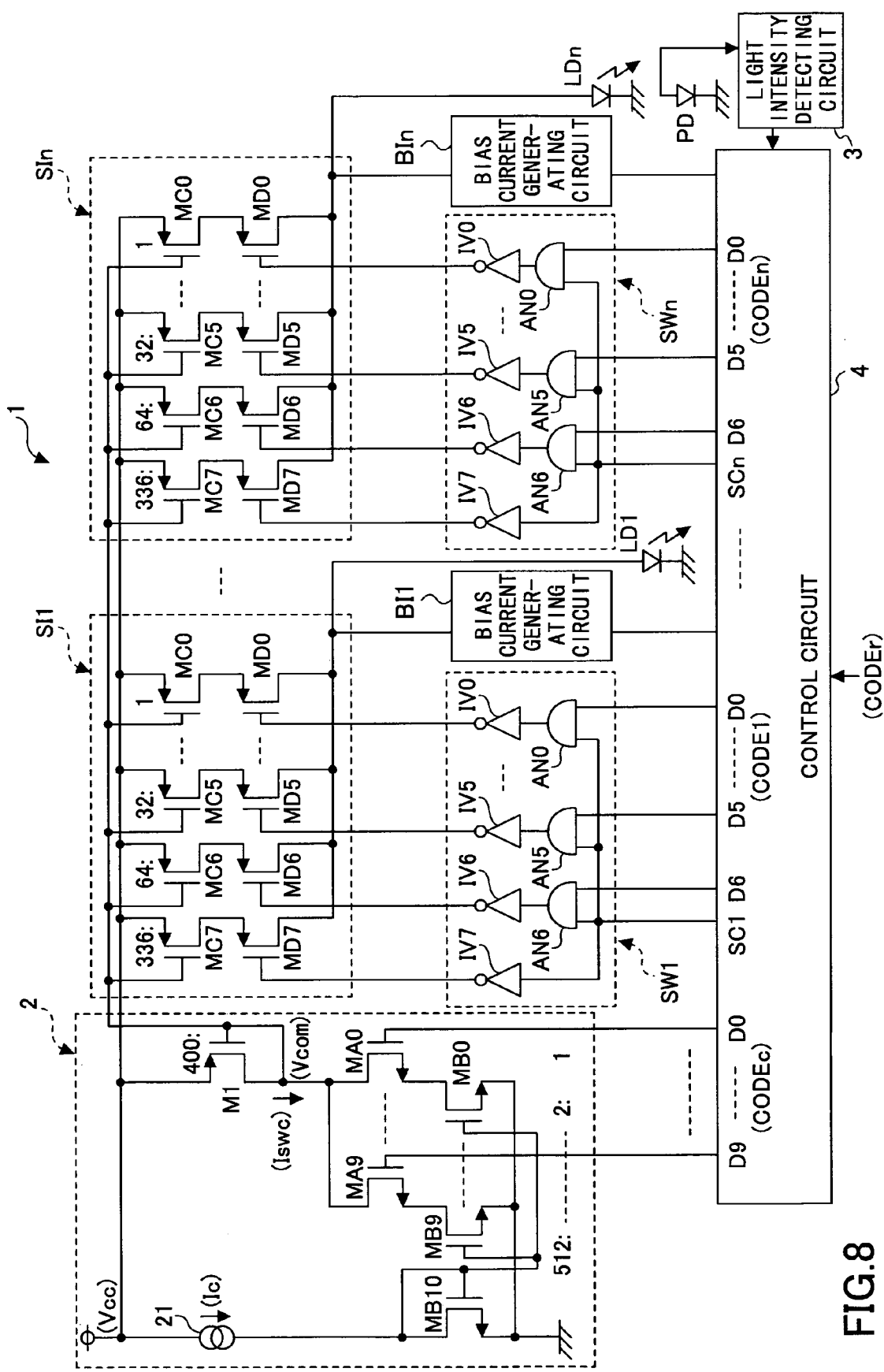
FIG. 8 is an exemplary circuit diagram of the laser diode driving device 1 shown in FIG. 2.

FIG. 8 is an exemplary circuit diagram of the laser diode driving device 1 shown in FIG. 2. In FIG. 2, the switches SW1 through SWn are provided between the output terminals of the switch current generating circuits SI1 through SIn and the anodes of the corresponding laser diodes LD1 through LDn. In the example shown in FIG. 8, the switches SW1 through SWn are provided to control the flow of the digital data signals CODE1 through CODEn from the control circuit 4 to the corresponding switch current generating circuits SI1 through SIn.

As shown in FIG. 8, the common switch current generating circuit 2 includes a PMOS transistor M1, NMOS transistors MA0 through MA9 and MB0 through MB10, and a constant-current source 21. The switch current generating circuits SI1 through SIn have substantially the same circuit configuration and each of the switch current generating circuits SI1 through SIn includes PMOS transistors MC0 through MC7 and MD0 through MD7. The switches SW1 through SWn have substantially the same circuit configuration and each of the switches SW1 through SWn includes AND circuits AN0 through AN6 and inverters IV0 through IV7.

In the common switch current generating circuit 2, the NMOS transistors MB0 through MB10 form current mirror circuits. The sources of the NMOS transistors MB0 through MB10 are connected to a ground potential. The gates of the NMOS transistors MB0 through MB10 are interconnected and are connected via a junction point to the drain of the NMOS transistor MB10.

The constant-current source 21 is connected between a supply voltage Vcc and the drain of the NMOS transistor MB10. The source of the PMOS transistor M1 is connected to the supply voltage Vcc and the gate is connected to the drain. The NMOS transistors MA0 through MA9 are connected between the drain of the PMOS transistor M1 and the drains of the corresponding NMOS transistors MB0 through MB9. Data signals D0 through D9 constituting the digital data signal CODEc are input from the control circuit 4 to the gates of the corresponding NMOS transistors MA0 through MA9.

As described above, the switch current generating circuits SI1 through SIn have substantially the same circuit configuration and the switches SW1 through SWn have substantially the same circuit configuration. Therefore, the descriptions below are given using a switch current generating circuit SIk (k represents any number from 1 to n) and a switch SWk.

In the switch current generating circuit SIk, the PMOS transistors MC0 through MC7, together with the PMOS transistor M1 of the common switch current generating circuit 2, form current mirror circuits. The sources of the PMOS transistors MC0 through MC7 are connected to the supply voltage Vcc. The gates of the PMOS transistors MC0 through MC7 are interconnected and are connected via a junction point to the gate of the PMOS transistor M1. The drains of the PMOS transistors MC0 through MC7 are connected to the sources of the corresponding PMOS transistors MD0 through MD7. The drains of the PMOS transistors MD0 through MD7 are interconnected and are connected via a junction point, which serves as an output terminal of the switch current generating circuit SIk, to the anode of a laser diode LDk.

In the switch SWk, data signals D0 through D6 constituting a digital data signal CODEk are input from the control circuit 4 to the odd ones of the input terminals of the AND circuits AN0 through AN6, and a control signal SCk is input from the control circuit 4 to the other ones of the input terminals of the AND circuits AN0 through AN6. The output terminals of the AND circuits AN0 through AN6 are connected to the input terminals of the corresponding inverters IV0 through IV6 and the output terminals of the inverters IV0 through IV6 are connected to the gates of the corresponding PMOS transistors MD0 through MD6. The control signal SCk is also input to the input terminal of the inverter IV7. The output terminal of the inverter IV7 is connected to the gate of the PMOS transistor MD7.

With the above configuration, the NMOS transistors MA0 through MA9 are turned on or off according to signal levels of the data signals D0 through D9 from the control circuit 4 which constitute the digital data signal CODEc. This in turn causes the drains of the NMOS transistors MB0 through MB9 to be selectively connected to the drain of the PMOS transistor M1. For example, when only the data signal D0 of the data signals D0 through D9 constituting the digital data signal CODEc is high, the NMOS transistor MA0 is turned on and the NMOS transistors MA1 through MA9 are turned off. As a result, a current that is proportional to a constant current Ic output from the constant-current source 21 is generated by the current mirror circuit formed by the NMOS transistor MB10 and the NMOS transistor MB0. In other words, a current obtained by multiplying the constant current Ic by a proportionality constant determined by the size ratio of the NMOS transistor MB10 to the NMOS transistor MB0 is supplied to the drain of the PMOS transistor M1.

In the switch current generating circuit SIk, when the control signal SCk from the control circuit 4 is high, the PMOS transistor MD7 is turned on and the PMOS transistors MD0 through MD6 are turned on or off according to signal levels of the data signals D0 through D6 from the control circuit 4 which constitute the digital data signal CODEk. This in turn causes the drains of the PMOS transistors MC0 through MC6 to be selectively connected to the anode of the laser diode LDk. For example, when only the data signal D0 of the data signals D0 through D6 constituting the digital data signal CODEk is high, the PMOS transistor MD0 is turned on and the PMOS transistors MD1 through MD6 are turned off.

As a result, a current that is proportional to the common switch current Iswc flowing through the PMOS transistor M1 is generated by the current mirror circuit formed by the PMOS transistor M1, the PMOS transistor MC0, and the PMOS transistor MC7. In other words, a current obtained by adding a first current obtained by multiplying the common switch current Iswc by a proportionality constant determined by the size ratio of the PMOS transistor M1 to the PMOS transistor MC0 and a second current obtained by multiplying the common switch current Iswc by a proportionality constant determined by the size ratio of the PMOS transistor M1 to the PMOS transistor MC7 is supplied to the laser diode LDk. When the control signal SCk from the control circuit 4 is low, the PMOS transistor MD7 is turned off and also the PMOS transistors MD0 through MD6 are turned off regardless of the state of the digital data signal CODEk. As a result, the switch current Iswk is not output.

For example, when the size of the NMOS transistor MB0 is 1, the size of an NMOS transistor MBh (h is any number from 0 to 9 representing the NMOS transistors MB0 through MB9) is $2^h$ times as large as the size of the NMOS transistor MB0. Similarly, when the size of the PMOS transistor MC0 is 1, the size of a PMOS transistor MCi (i is any number from 0 to 6 representing the PMOS transistors MC0 through MC6) is $2^i$ times as large as the size of the PMOS transistor MC0. The size of the PMOS transistor MC7 is 336 times greater than the size of the PMOS transistor MC0 and the size of the PMOS transistor M1 is 400 times greater than the size of the PMOS transistor MC0.

Here, assume that the light intensities of the laser diodes LD1 through LDn are controlled within a setting range and switch currents are adjusted within a setting range between 1.25 mA and 5 mA. For example, to set the light intensity of the laser diodes LD1 through LDn with a resolution of 0.5% or smaller, it is necessary to be able to set switch currents with a resolution of 0.5% or smaller. When the maximum output current of a D/A converter is 5 mA, a setting scale of at least 200 steps (a resolution of 0.5% or 6.25 µA) is necessary to output the minimum switch current of 1.25 mA. When a setting scale has 250 steps (a resolution of 0.4% or 5 µA) for a switch current of 1.25 mA, 1000 steps (5 mA/5 µA) are necessary for a switch current of 5 mA. In this case, a D/A converter with a resolution of 10 bits is necessary to set a switch current. The common switch current generating circuit 2 of this embodiment is implemented by a 10-bit D/A converter.

When the common switch current Iswc is controlled within a range between 0 and 5 mA and is set at 1.25 mA, the DAC code is 256 (a resolution of 0.4%). As described above, the common switch current generating circuit 2 and the respective switch current generating circuits SI1 through SIn are connected via current mirror circuits. The size of the PMOS transistor M1 of the common switch current generating circuit 2 is 400 and the size of the respective PMOS transistors MC7 of the switch current generating circuits SI1 through SIn is 336. The PMOS transistors MC7 are turned on while the corresponding control signals SC1 through SCn output from the control circuit 4 are high.

With the PMOS transistors MC7 turned on, currents output from the PMOS transistors MC0 through MC6 of the respective switch current generating circuits SI1 through SIn are selectively output to the corresponding laser diodes LD1 through LDn according to the data signals D0 through D6 constituting the respective digital data signals CODE1 through CODEn. Thus, the switch current generating circuits SI1 through SIn function as 7-bit D/A converters and generate the switch currents Isw1 through Iswn by adjusting the common switch current Iswc within a range between -16% and +16% with a resolution of 0.25%.

Table 1 shows an exemplary relationship between the digital data signal CODEk and the proportionality constant $\alpha k$. The data signals D0 through D6 of the respective digital data signals CODE1 through CODEn provide a resolution of 1/400=0.25%.

TABLE 1

| CODEk | Transistor size | Proportionality constant $\alpha k$ |
|---|---|---|
| 0000000 | 336 | 336/400 |
| 1000000 | 400 | 400/400 |
| 1000001 | 401 | 401/400 |
| 1111111 | 463 | 463/400 |

With conventional technologies, to set switch currents within a setting range between 1.25 mA and 5 mA with a resolution of 0.5% for a multi-beam laser capable of emitting 40 laser beams, 40 sets of 10-bit D/A converters are necessary. Meanwhile, with the configuration of this embodiment, this can be done with one 10-bit D/A converter and 40 sets of 7-bit D/A converters. Thus, the above configuration makes it possible to reduce the chip size and costs of a semiconductor integrated circuit used for a laser diode driving device. Also, when changing the light intensity of laser diodes at the same rate, it can be done by just changing the digital data signal CODEc to be input to the common switch current generating unit 2 without changing the digital data signals CODE1 through CODEn to be input to the switch current generating circuits SI1 through SIn. Therefore, in this case, an arithmetic circuit for calculating digital data is necessary only for the common switch current generating circuit 2. Accordingly, this configuration makes it possible to further reduce the chip size and costs of a semiconductor integrated circuit.

An exemplary process of halving the light intensity of three laser diodes (n=3) by changing the value of the digital data signal CODEc from 512 to 256 is described below.

Here, it is assumed that the bias currents Ib1 through Ib3 to be supplied to the laser diodes LD1 through LD3 are all 1 mA and the switch currents Isw1 through Isw3 become 2 mA when the value of the digital data signal CODEc is 512 and the digital data signals CODE1 through CODE3 are "1000000b".

Figure 9:
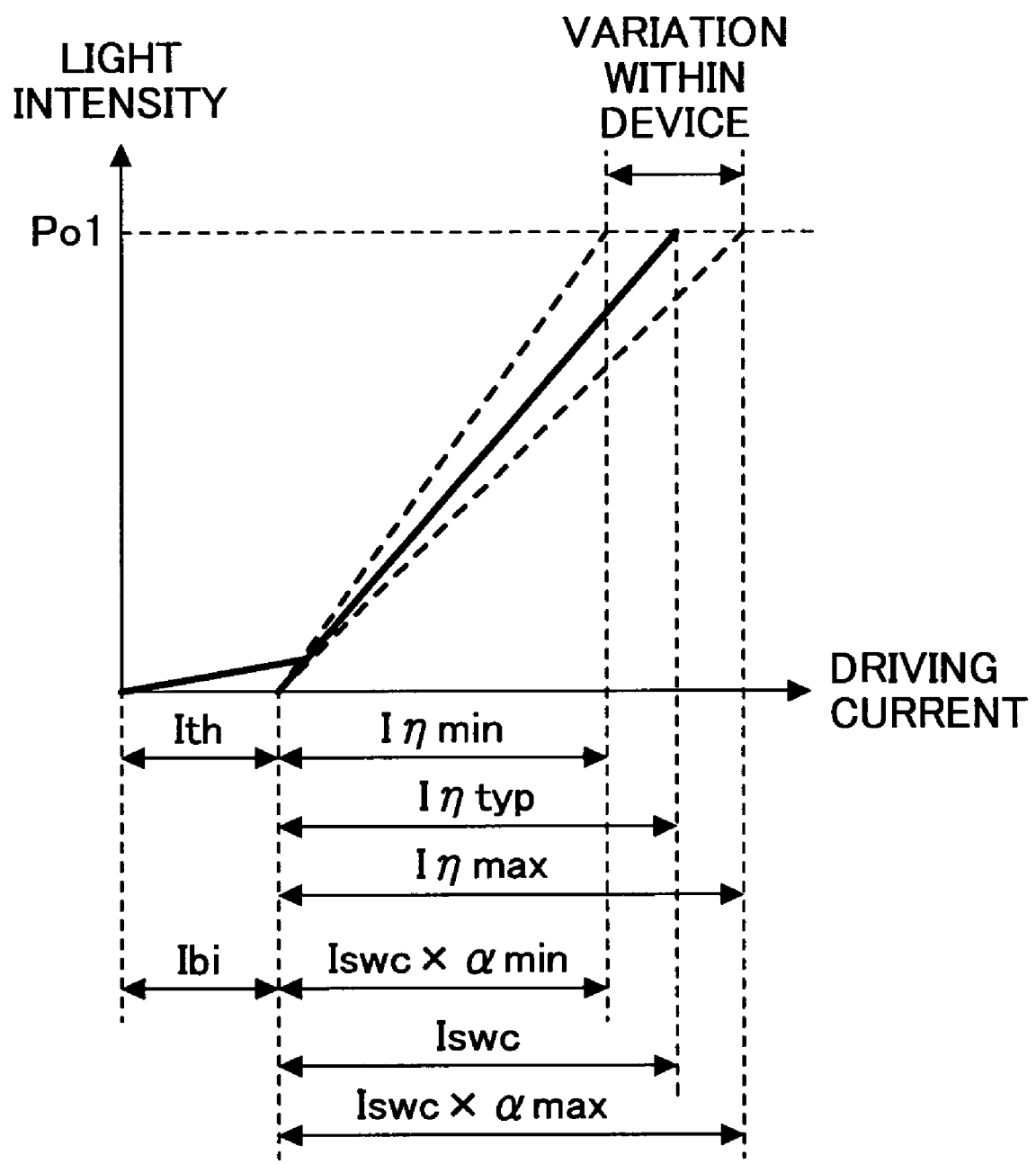
FIG. 9 is a graph used to describe a process of adjusting a switch current with a proportionality constant α.
Figure 10:
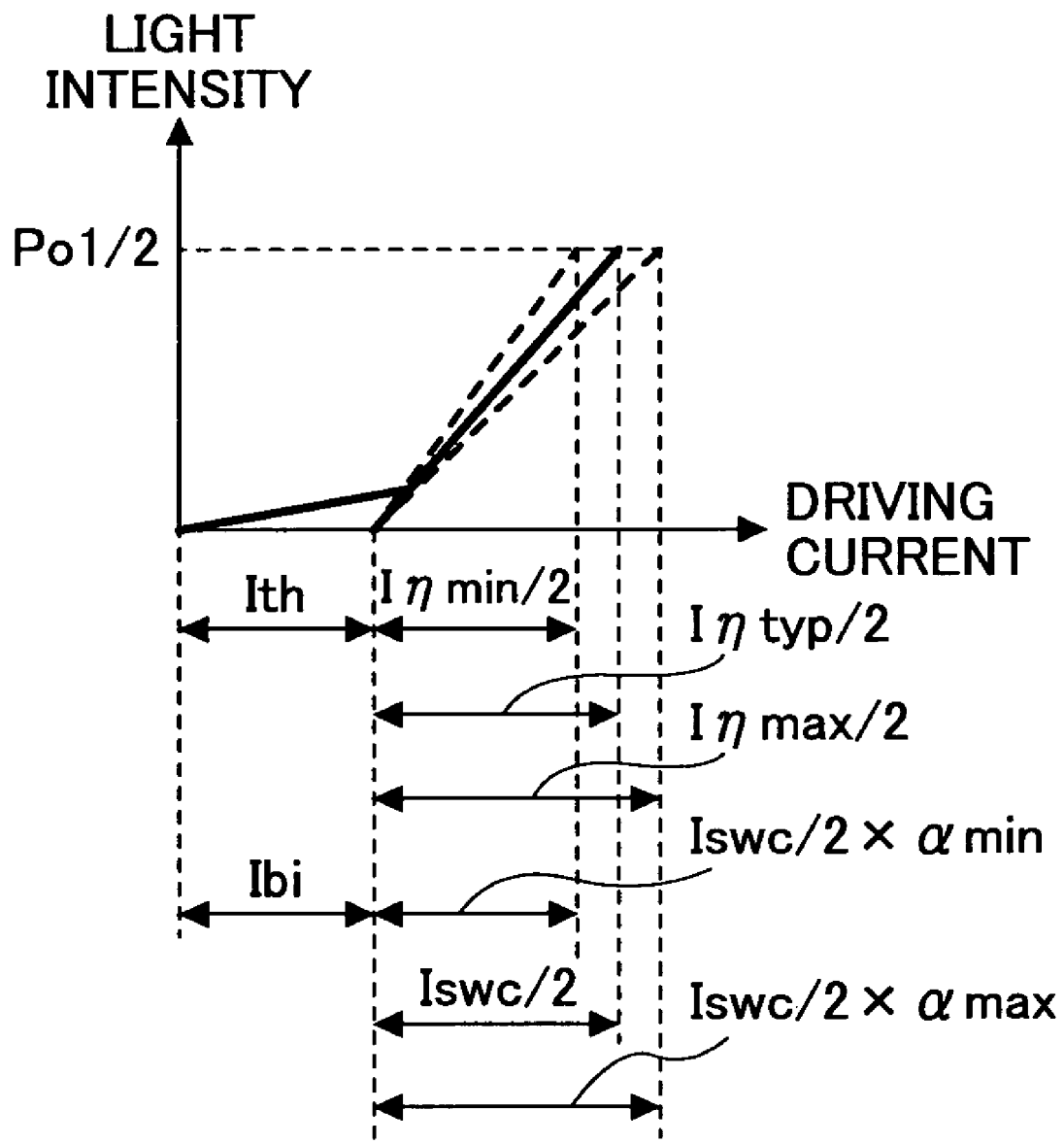
FIG. 10 is a graph used to describe a case where a common switch current is halved.

The differences in differential efficiency between the laser diodes LD1 through LD3 are corrected by switch currents as shown in table 2 so that the light intensities of the laser diodes LD1 through LD3 become equal. FIGS. 9 and 10 show the relationship between the driving current and the light intensity of a laser diode. FIG. 9 is a graph used to describe a process of adjusting a switch current with a proportionality constant $\alpha$. FIG. 10 is a graph used to describe a case where a common switch current is halved (Iswc→Iswc/2).

TABLE 2

| | Differential efficiency (W/A) | CODE1-3 | Isw1-Isw3 (mA) | Light intensity (mW) |
|---|---|---|---|---|
| LD1 | 1/0.84 | 0000000b | 2 × 0.84→0.84 | 2→1 |
| LD2 | 1 | 1000000b | 2→1 | 2→1 |
| LD3 | 1/1.16 | 1111111b | 2 × 1.16→1.16 | 2→1 |

In the example shown in FIG. 8, a gate voltage Vcom of the PMOS transistor M1 is output from the common switch current generating circuit 2 to the switch current generating circuits SI1 through SIn to supply the common switch current Iswc. Alternatively, the common switch current Iswc may be supplied directly from the common switch current generating circuit 2 to the switch current generating circuits SI1 through SIn. In this case, the PMOS transistor M1 may be removed from the common switch current generating circuit 2 and provided in each of the switch current generating circuits SI1 through SIn.

Figure 11:
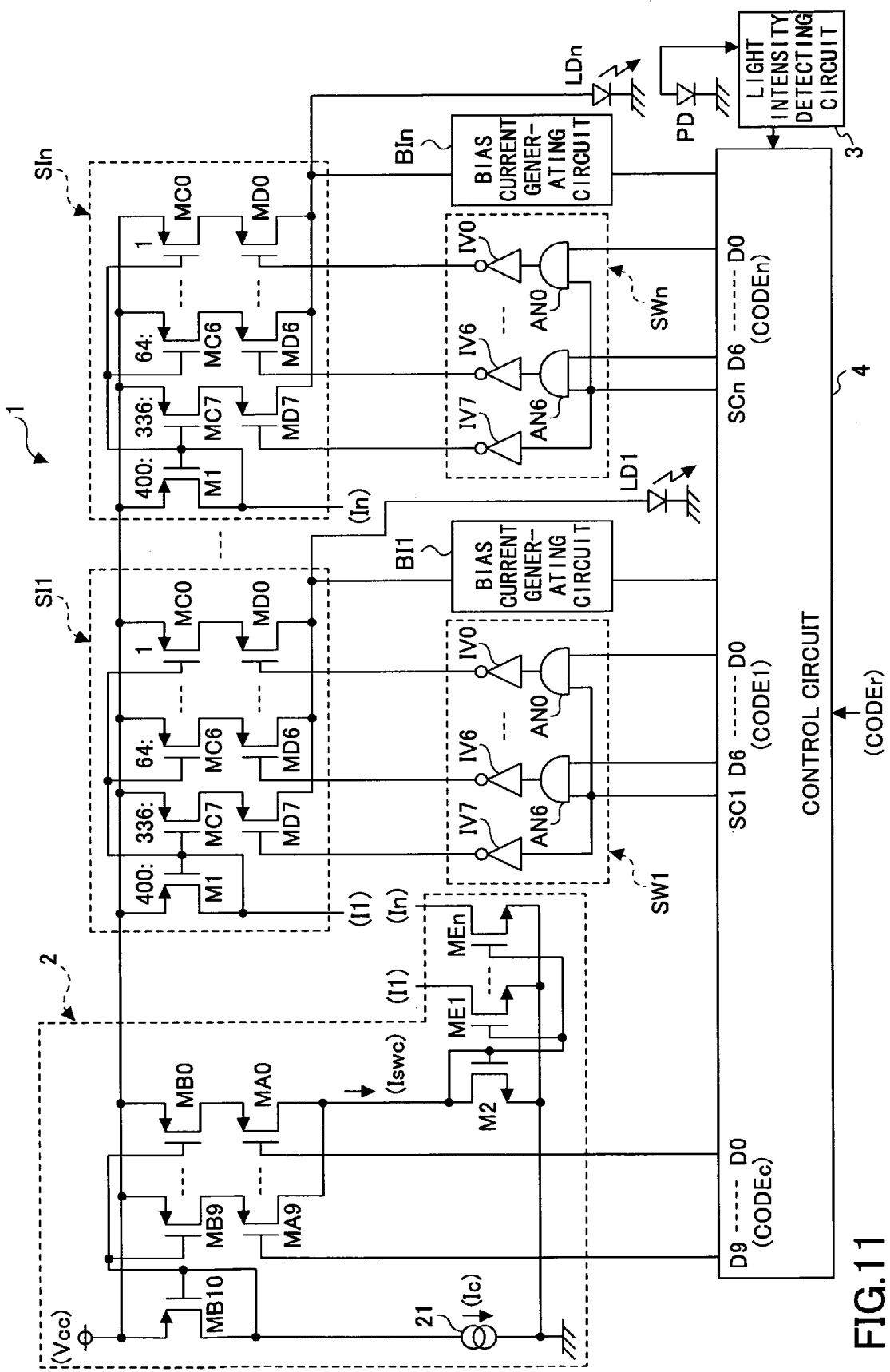
FIG. 11 is another exemplary circuit diagram of the laser diode driving device 1 shown in FIG. 2.

In FIG. 8, the information on the common switch current Iswc is conveyed by the voltage Vcom from the common switch current generating circuit 2 to the switch current generating circuits SI1 through SIn. With this configuration, the common switch current generating circuit 2 and the switch current generating circuits SI1 through SIn are generally placed in distant positions when they are integrated on one IC. In this case, if the supply voltage Vcc of the common switch current generating circuit 2 and the supply voltage Vcc of the switch current generating circuits SI1 through SIn fluctuate, the information on the common switch current Iswc may not be conveyed correctly to the switch current generating circuits SI1 through SIn. This problem may be reduced or solved by changing the configuration as shown in FIG. 11. Components shown in FIG. 11 that correspond to those shown in FIG. 8 are assigned the same reference numbers and descriptions of those components are omitted. Here, differences between the two configurations are mainly discussed.

The configuration shown in FIG. 11 differs from that shown in FIG. 8 in that the NMOS transistors MA0 through MA9 and MB0 through MB10 of the common switch current generating circuits 2 are changed to PMOS transistors, NMOS transistors M2 and ME1 through MEn are added to the common switch current generating circuits 2, and the PMOS transistor M1 shown in FIG. 8 is added to each of the switch current generating circuits SI1 through SIn. As shown in FIG. 11, the common switch current generating circuit 2 includes PMOS transistors MA0 through MA9 and MB0 through MB10, the NMOS transistors M2 and ME1 through MEn, and the constant-current source 21. Each of the switch current generating circuits SI1 through SIn includes the PMOS transistors M1, MC0 through MC7, and MD0 through MD7.

In the common switch current generating circuit 2 shown in FIG. 11, the PMOS transistors MB0 through MB10 form current mirror circuits. The sources of the PMOS transistors MB0 through MB10 are connected to the supply voltage Vcc. The gates of the PMOS transistors MB0 through MB10 are interconnected and are connected via a junction point to the drain of the PMOS transistor MB10. The constant-current source 21 is connected between the drain of the PMOS transistor MB10 and a ground potential. The source of the NMOS transistor M2 is connected to the ground potential and the gate is connected to the drain. The PMOS transistors MA0 through MA9 are connected between the drain of the NMOS transistor M2 and the drains of the corresponding PMOS transistors MB0 through MB9. Data signals D0 through D9 constituting the digital data signal CODEc are input from the control circuit 4 to the gates of the corresponding PMOS transistors MA0 through MA9.

The NMOS transistors M2 and ME1 through MEn form current mirror circuits. The sources of the NMOS transistors ME1 through MEn are connected to the ground potential. The gates of the NMOS transistors ME1 through MEn are interconnected and are connected via a junction point to the gate of the NMOS transistor M2. Currents I1 through In are supplied from the drains of the NMOS transistors ME1 through MEn to the drains of the PMOS transistors M1 of the corresponding switch current generating circuits SI1 through SIn. Thus, the information on the common switch current Iswc is conveyed to the switch current generating circuits SI1 through SIn by the currents I1 through In. This configuration makes it possible to correctly convey the information on the common switch current Iswc to the switch current generating circuits SI1 through SIn even when the supply voltage Vcc fluctuates. Meanwhile, when the fluctuation of the supply voltage Vcc is negligible, the NMOS transistors ME2 through MEn may be omitted and the current I1 may be supplied from the NMOS transistor ME1 to the drains of the PMOS transistors M1 of the switch current generating circuits SI1 through SIn.

Figure 12:
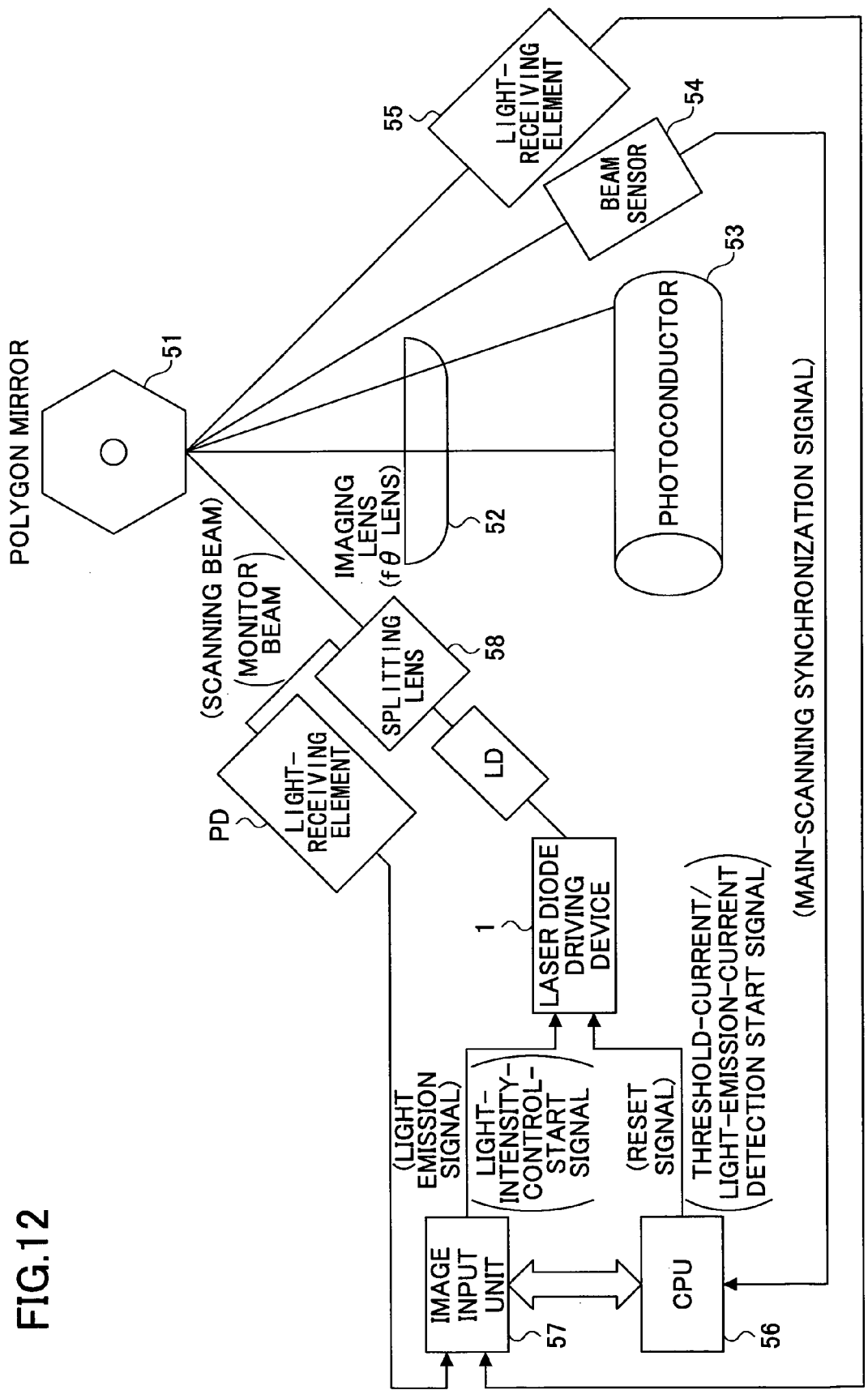
FIG. 12 is a schematic diagram illustrating an exemplary configuration of an image forming apparatus using the laser diode driving device 1.
Figure 13:
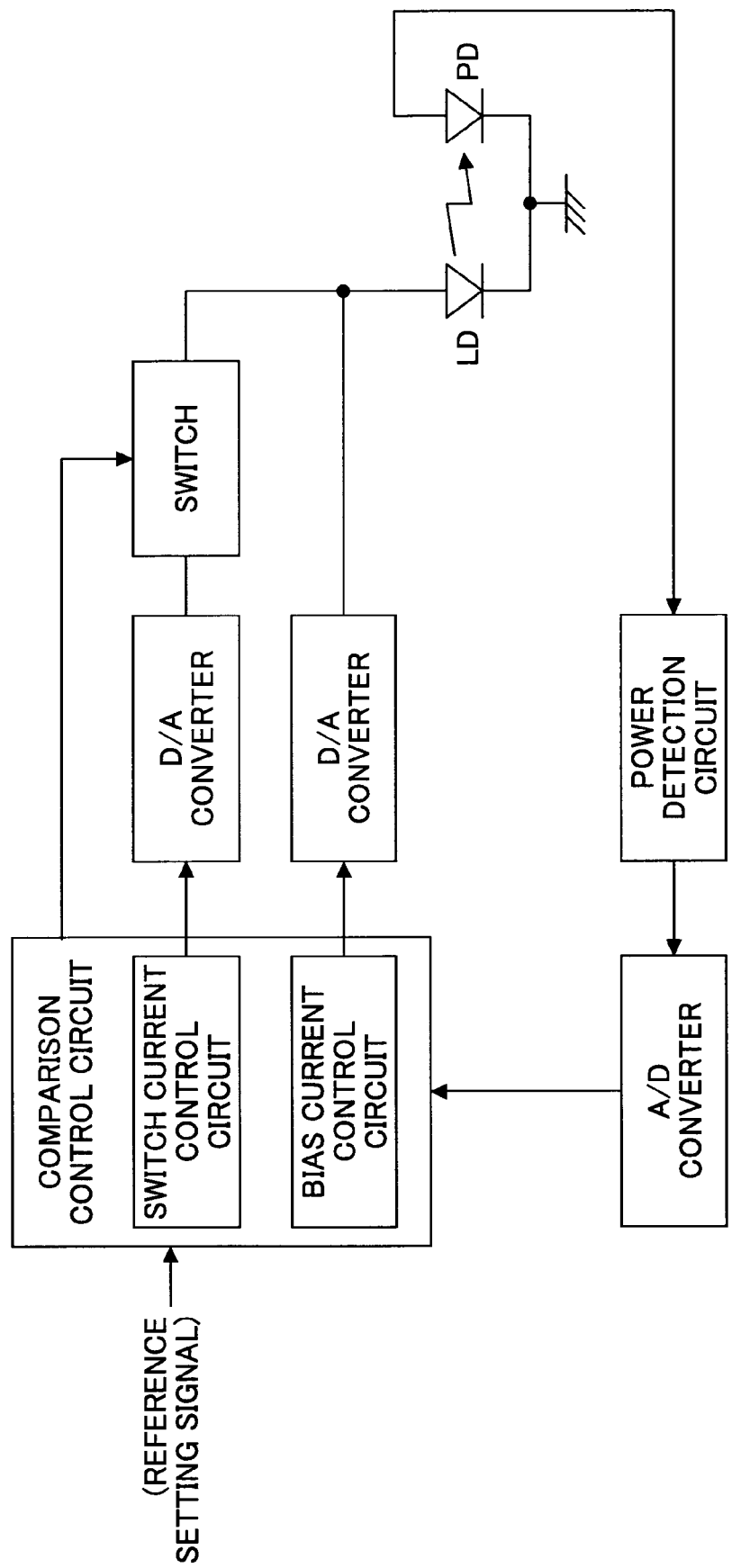
FIG. 13 is a block diagram illustrating an exemplary configuration of a related art laser diode driving device.

FIG. 12 is a schematic diagram illustrating an exemplary configuration of an image forming apparatus using the laser diode driving device 1. In FIG. 12, laser beams emitted from a multi-beam laser LD are deflected by a polygon mirror 51 rotating at a constant high-speed, pass through an fθ lens 52 used as an imaging lens, and are focused on the surface of a photoconductor 53. The deflected laser beams are scanned in a direction (main-scanning direction) that is orthogonal to the rotational direction of the photoconductor 53 to record an image line by line according to an image signal. The laser beams are repeatedly scanned in the main-scanning direction at intervals corresponding to the rotational speed of the photoconductor 53 and the recording density to form an image (an electrostatic latent image) on the surface of the photoconductor 53.

A beam sensor 54 for generating a main-scanning synchronization signal is disposed in a position that is near one end of the photoconductor 53 and within the scanning range of the laser beams. Based on the main-scanning synchronization signal, a control signal is generated. The control signal is used to control the timing of recording an image in the main-scanning direction and to input and output an image signal. Threshold currents and light-emission currents of the multi-beam laser LD are detected at certain intervals. Since the threshold currents are affected by temperature variation, detection of the currents may be performed according to temperature variation predicted by counting, for example, the number of printed pages or the number of printed dots. The power of each laser beam may be measured, for example, by the following two methods:

Split the laser beam into a monitor beam for measuring the light intensity and a scanning beam for scanning the photoconductor 53, and measure the power of the laser beam using the monitor beam.

Place a light-receiving element 55 in a position that is near one end of the photoconductor 53 and within the scanning range of the laser beam, and measure the actual power of the laser beam on the photoconductor 53.

A CPU 56 inputs signals including a reset signal and a threshold-current/light-emission-current detection start signal to the laser diode driving device 1 and an image input unit 57 inputs signals including a light emission signal and a light-intensity-control start signal to the laser diode driving device 1.

As described above, in the laser diode driving device 1 of this embodiment, the common switch current generating circuit 2 implemented as a D/A converter generates the common switch current Iswc according to the digital data signal CODEc output from the control circuit 4 and the switch current generating circuits SI1 through SIn implemented as D/A converters generate, respectively, the switch currents Isw1 through Iswn based on the common switch current Iswc and according to the digital data signals CODE1 through CODEn output from the control circuit 4. This configuration makes it possible to reduce the sizes of D/A converters used as the switch current generating circuits SI1 through SIn, and thereby makes it possible to reduce the chip size and costs of a semiconductor integrated circuit used for a laser diode driving device and to improve the yield in mounting and production processes.

An aspect of the present invention provides a laser diode driving device for controlling the light intensities of laser diodes and an image forming apparatus including the laser diode driving device where a common switching current generating circuit generates a common switch current according to a signal from a control circuit and switch current generating circuits generate switch currents based on the common switch current and according to signals from the control circuit. This configuration makes it possible to reduce the sizes of D/A converters used as the switch current generating circuits, and thereby makes it possible to reduce the chip size and costs of a semiconductor integrated circuit used for a laser diode driving device and to improve the yield in mounting and production processes.

The present invention is not limited to the specifically disclosed embodiments, and variations and modifications may be made without departing from the scope of the present invention.

The present application is based on Japanese Priority Application No. 2007-339655, filed on Dec. 28, 2007, the entire contents of which are hereby incorporated herein by reference.

The invention claimed is:

1. A laser diode driving device for driving laser diodes with driving currents obtained by adding switch currents to corresponding bias currents less than or equal to threshold currents of the laser diodes and for controlling the driving currents to adjust light intensities of the laser diodes, the device comprising:
a common switch current generating circuit configured to generate a common switch current according to an input signal;
switch current generating circuits provided for the corresponding laser diodes and configured to generate the switch currents based on the common switch current and according to input signals;
switches configured to control the output of the switch currents to the corresponding laser diodes according to input signals;
bias current generating circuits configured to generate the bias currents and output the generated bias currents to the corresponding laser diodes; and
a control unit configured to detect the light intensities of the respective laser diodes and to control the common switch current generating circuit, the switch current generating circuits, and the switches to adjust the light intensities of the respective laser diodes,
wherein the common switch current from the common switch current generating circuit is supplied to plural ones of the switch current generating circuits, and each of the plural ones of the switch current generating circuits generates a switch current based on the common switch current, and
wherein the switch currents generated by the plural ones of the switch current generating circuits are proportional to the common switch current.

2. The laser diode driving device as claimed in claim 1, wherein when changing the light intensities of the laser diodes, the control unit is configured to cause the common switch current generating circuit to change the common switch current according to the amount of change in the light intensities.

3. A laser diode driving device for driving laser diodes with driving currents obtained by adding switch currents to corresponding bias currents less than or equal to threshold currents of the laser diodes and for controlling the driving currents to adjust light intensities of the laser diodes, the device comprising:
a common switch current generating circuit configured to generate a common switch current according to an input signal;
switch current generating circuits provided for the corresponding laser diodes and configured to generate the switch currents based on the common switch current and according to input signals;
switches configured to control the output of the switch currents to the corresponding laser diodes according to input signals;
bias current generating circuits configured to generate the bias currents and output the generated bias currents to the corresponding laser diodes; and
a control unit configured to detect the light intensities of the respective laser diodes and to control the common switch current generating circuit, the switch current generating circuits, and the switches to adjust the light intensities of the respective laser diodes,
wherein when changing the light intensities of the laser diodes, the control unit is configured to cause the common switch current generating circuit to change the common switch current according to the amount of change in the light intensities, and
wherein the control unit is configured to cause the switch current generating circuits to generate the switch currents obtained by multiplying the common switch current by corresponding proportionality constants.

4. The laser diode driving device as claimed in claim 3, wherein when changing the light intensities of the laser diodes, the control unit is configured to cause the switch current generating circuits to change the proportionality constants according to the amount of change in the light intensities.

5. The laser diode driving device as claimed in claim 3, wherein when the proportionality constants have the same setting range, the control unit is configured to determine the common switch current such that an average value of the proportionality constants becomes a center value in the setting range.

6. The laser diode driving device as claimed in claim 3, wherein when the proportionality constants have the same setting range, the control unit is configured to determine the common switch current such that a center value between the highest and lowest ones of the proportionality constants becomes a center value in the setting range.

7. A laser diode driving device for driving laser diodes with driving currents obtained by adding switch currents to corresponding bias currents less than or equal to threshold currents of the laser diodes and for controlling the driving currents to adjust light intensities of the laser diodes, the device comprising:
a common switch current generating circuit configured to generate a common switch current according to an input signal;
switch current generating circuits provided for the corresponding laser diodes and configured to generate the switch currents based on the common switch current and according to input signals;
switches configured to control the output of the switch currents to the corresponding laser diodes according to input signals;
bias current generating circuits configured to generate the bias currents and output the generated bias currents to the corresponding laser diodes; and
a control unit configured to detect the light intensities of the respective laser diodes and to control the common switch current generating circuit, the switch current generating circuits, and the switches to adjust the light intensities of the respective laser diodes,
wherein the common switch current generating circuit is implemented by a D/A converter and configured to generate the common switch current according to a digital data signal input from the control unit.

8. The laser diode driving device as claimed in claim 1, wherein the switch current generating circuits are implemented by D/A converters and configured to generate the switch currents based on the common switch current and according to digital data signals input from the control unit.

9. The laser diode driving device as claimed in claim 1, wherein the bias current generating circuits are implemented by D/A converters.

10. The laser diode driving device as claimed in claim 1, wherein the control unit includes:
a light-receiving element configured to detect the light intensities of the respective laser diodes and to output currents corresponding to the detected light intensities;

a current-voltage converting circuit configured to convert the currents output from the light-receiving element into voltages;

an A/D converting circuit configured to convert from analog to digital the voltages output from the current-voltage converting circuit; and a control circuit configured to detect the light intensities of the laser diodes based on the voltages output from the A/D converting circuit and to control the common switch current generating circuit, the switch current generating circuits, and the switches to adjust the light intensities of the respective laser diodes.

11. The laser diode driving device as claimed in claim 10, wherein the common switch current generating circuit, the switch current generating circuits, the switches, the bias current generating circuits, and the control circuit are integrated on one IC.

12. An image forming apparatus comprising the laser diode driving device as claimed in claim 1.

* * * * *